(12) United States Patent
Cheng et al.

(10) Patent No.: US 11,605,795 B2
(45) Date of Patent: Mar. 14, 2023

(54) ORGANIC LIGHT-EMITTING DISPLAY PANEL AND DISPLAY DEVICE WITH EARTH METAL DOPANTS

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Qing Zhu, Shanghai (CN); Yinhe Liu, Shanghai (CN); Xiaoxi Na, Shanghai (CN); Lei Wen, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 182 days.

(21) Appl. No.: 16/157,392

(22) Filed: Oct. 11, 2018

(65) Prior Publication Data
US 2019/0372048 A1 Dec. 5, 2019

(30) Foreign Application Priority Data
May 31, 2018 (CN) .......................... 201810551452.7

(51) Int. Cl.
*H01L 51/50* (2006.01)
*H01L 27/32* (2006.01)

(52) U.S. Cl.
CPC ...... *H01L 51/5076* (2013.01); *H01L 27/3244* (2013.01); *H01L 51/5004* (2013.01);
(Continued)

(58) Field of Classification Search
CPC ............. H01L 51/5076; H01L 51/5004; H01L 51/5064; H01L 51/508; H01L 51/5088;
(Continued)

(56) References Cited

U.S. PATENT DOCUMENTS

| | | | | |
|---|---|---|---|---|
| 2007/0096640 A1* | 5/2007 | Yu | ........................ | H01L 27/3211 313/504 |
| 2007/0114919 A1* | 5/2007 | Sotoyama | ............ | C09K 11/616 313/504 |

(Continued)

FOREIGN PATENT DOCUMENTS

| | | |
|---|---|---|
| CN | 103594659 A | 2/2014 |
| CN | 106601921 A | 4/2017 |

OTHER PUBLICATIONS

Zhuo, Ming-Peng. "WO3 nanobelt dp[ed PEDOT:PSS layers . . . " Oct. 8, 2017, Journals of Materials Chemistry C, vol. 5, 12343. (Year: 2017).*

(Continued)

*Primary Examiner* — Didarul A Mazumder
*Assistant Examiner* — Gustavo G Ramallo
(74) *Attorney, Agent, or Firm* — Tarolli, Sundheim, Covell & Tummino LLP (57) ABSTRACT

Provided are an organic light-emitting display panel and a display device. The organic light-emitting display includes an array substrate and organic light-emitting components each having an anode, a cathode and an organic functional layer. The organic functional layer includes an organic light-emitting layer, a first electron transmission layer, and a hole injection layer. LUMO1 and LUMO4 satisfy: |LUMO1−LUMO4|<1.7 eV. HOMO5 and HOMO4 satisfy: |HOMO5−HOMO4|<1 eV. A work function φ1 of the first dopant and a work function φ4 of the cathode satisfy:

(Continued)

$\varphi 1 < \varphi 4$, and a work function $\varphi 2$ of the second dopant and a work function $\varphi 3$ of the anode satisfy: $\varphi 2 > \varphi 3$.

15 Claims, 6 Drawing Sheets

(52) U.S. Cl.
CPC ........ *H01L 51/508* (2013.01); *H01L 51/5064* (2013.01); *H01L 51/5088* (2013.01); *H01L 2251/552* (2013.01)

(58) Field of Classification Search
CPC ... H01L 51/506; H01L 51/52; H01L 27/3244; H01L 27/32; H01L 2251/552
See application file for complete search history.

(56) References Cited

U.S. PATENT DOCUMENTS

| | | | | |
|---|---|---|---|---|
| 2008/0284322 | A1* | 11/2008 | Hosokawa | C07D 235/20 313/504 |
| 2012/0025181 | A1* | 2/2012 | Sasaki | H01L 51/508 257/40 |
| 2014/0014923 | A1* | 1/2014 | Jang | H01L 51/5268 257/40 |
| 2015/0090984 | A1* | 4/2015 | Kang | H01L 51/52 257/40 |
| 2015/0236274 | A1* | 8/2015 | Hatakeyama | H01L 51/0054 257/40 |
| 2015/0263305 | A1* | 9/2015 | Premutico | H01L 51/5016 257/40 |
| 2016/0365527 | A1* | 12/2016 | Gao | C09K 11/025 |
| 2017/0229672 | A1* | 8/2017 | Denker | H01L 51/5004 |
| 2017/0279064 | A1* | 9/2017 | Wallikewitz | H01L 51/508 |
| 2017/0301876 | A1* | 10/2017 | Bloom | H01L 51/5056 |
| 2018/0076394 | A1* | 3/2018 | Kawakami | H01L 51/0065 |
| 2018/0261784 | A1* | 9/2018 | Wallikewitz | H01L 51/5096 |
| 2019/0019965 | A1* | 1/2019 | Sakamoto | C09K 11/06 |
| 2019/0123283 | A1* | 4/2019 | Kathirgamanathan | H01L 51/0059 |

OTHER PUBLICATIONS

Dai, Yanfeng. "Highly efficient and stable tandem organic light-emitting devices . . . " May 21, 2015, Journal of Materials Chemisty C, vol. 3, 6809-6814. (Year: 2015).*

* cited by examiner

FIG. 11 though the electron mobility and the hole mobility in the organic light-emitting diode, thereby avoiding the deviation of the recombination center of the electrons and holes, and improving the light-emitting efficiency.

ORGANIC LIGHT-EMITTING DISPLAY PANEL AND DISPLAY DEVICE WITH EARTH METAL DOPANTS

CROSS-REFERENCE TO RELATED APPLICATIONS

The present application claims the benefit of priority to Chinese Patent Application No. 201810551452.7, filed on May 31, 2018, the content of which is incorporated herein by reference in its entirety.

TECHNICAL FIELD

The present disclosure relates to the field of display technologies, and particularly, to an organic light-emitting display panel and a display device.

BACKGROUND

In recent years, with the development of the display technologies, various kinds of display devices emerge in the market. For example, liquid crystal display device, organic light-emitting display device and the like have already become the mainstream products in the current display industry, where the organic light-emitting display panel is the dominant trend of the display industry and becomes the hot spot of research in the display field due to its excellent characteristics of light-weight, thinness, low power consumption, high brightness, high contrast, high resolution, wide angle of view and the like.

One important component of the organic light-emitting display panel is the organic light-emitting diode. The organic light-emitting diode emits light through a light-emitting layer disposed between an anode and a cathode under an electric field applied between the anode and the cathode. In a conventional organic light-emitting diode, since a hole mobility is usually greater than an electron mobility, a recombination center of the holes and the electrons may deviate from the light-emitting layer, resulting in a decrease in the light-emitting efficiency of the light-emitting layer. Therefore, an problem to be solved urgently is how to further balance the hole mobility and the electron mobility in the organic light-emitting diode, so as to avoid a deviation of their recombination center.

SUMMARY

In view of the above, embodiments of the present disclosure provide an organic light-emitting display panel and a display device, for avoiding a shift of recombination centers of electrons and holes and thus improving a light-emitting efficiency.

In a first aspect, the present disclosure provides an organic light-emitting display panel. The organic light-emitting display panel includes: an array substrate including a plurality of driving elements; a plurality of organic light-emitting components corresponding to the plurality of driving elements, wherein each of the plurality of organic light-emitting components includes an anode, a cathode and an organic functional layer disposed between the anode and the cathode, wherein the organic functional layer includes an organic light-emitting layer, a first electron transmission layer disposed between the cathode and the organic light-emitting layer, and a hole injection layer disposed between the anode and the organic light-emitting layer. The first electron transmission layer includes an electron transmission matrix and a first dopant, the first dopant includes an alkaline earth metal element or a rare earth metal element, and the hole injection layer includes a hole injection matrix and a second dopant. A lowest unoccupied molecular orbital of the electron transmission matrix in the first electron transmission layer LUMO1 and a lowest unoccupied molecular orbital of a host material in the organic light-emitting layer LUMO4 satisfy: |LUMO1−LUMO4|<1.7 eV. A highest occupied molecular orbital of a hole injection matrix in the hole injection layer HOMO5 and a highest occupied molecular orbital of the host material in the organic light-emitting layer HOMO4 satisfy: |HOMO5−HOMO4|<1 eV. A work function φ1 of the first dopant and a work function φ4 of the cathode satisfy: φ1<φ4. The second dopant is an inorganic material, and a work function φ2 of the second dopant and a work function φ3 of the anode satisfy: φ2>φ3; or the second dopant is an organic material, and a lowest unoccupied molecular orbital LUMO of the second dopant and the work function φ3 of the anode satisfy |LUMO−φ3|<0.8 eV.

In a second aspect, the present disclosure provides an organic light-emitting display device. The organic light-emitting display device includes the organic light-emitting display panel as mentioned in the first aspect.

BRIEF DESCRIPTION OF DRAWINGS

In order to illustrate technical solutions of embodiments of the present disclosure or the related art, the accompanying drawings used in the embodiments or the related art are introduced hereinafter. These drawings merely illustrate some embodiments of the present disclosure. On the basis of these drawings, those skilled in the art can also obtain other drawings without paying any creative effort.

DESCRIPTION OF EMBODIMENTS

In order to clarify the objects, technical solutions and advantages of the present disclosure, the technical solutions in the embodiments of the present disclosure will be clearly and completely described with reference to the accompanying drawings. Obviously, the described embodiments are only a part of the embodiments, rather than all of them. Based on the embodiments of the present disclosure, any other embodiments obtained by those skilled in the art shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represent: (a) A exists alone; (b) A and B exist at the same time; or (c) B exists alone. In addition, the character "/" generally indicates "or".

It should be understood that, although expressions "first", "second", "third" etc. are used to describe specific electron transmission layers, they shall not be interpreted as limiting the specific electron transmission layers. These expressions are merely used to distinguish among the specific electron transmission layers. For example, without departing from the scope of the present disclosure, a first electron transmission layer also can be referred as a second electron transmission layer, and vice versa.

It should be noted that, the terms such as "on", "under", "left", "right" are used to describe orientations and locations in a view angel shown in the drawings, which shall not be interpreted as limitations of the present disclosure. In addition, in the context, it should be noted that, when an element is formed "on" or "under" another element, the element can be directly formed "on" or "under" the other element, or can be indirectly formed "above" or "below" the other element through an intervening element.

Before describing the embodiments of the present disclosure in detail, a structure of a related organic light-emitting display panel and the concept of the present disclosure are briefly introduced as follows.

Figure 1:
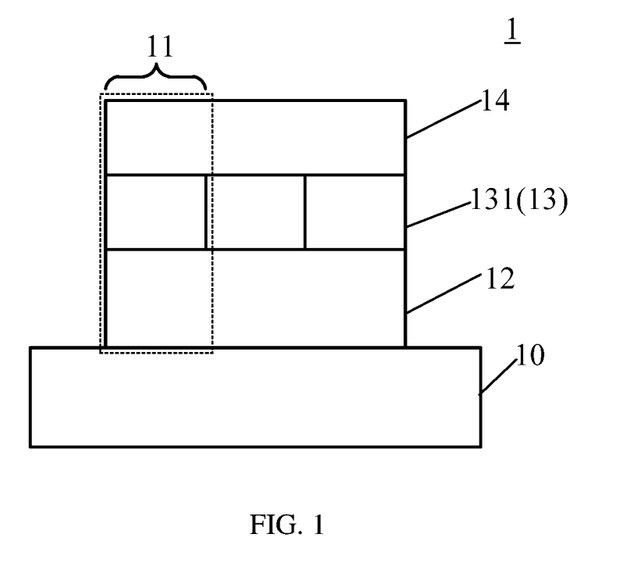
FIG. 1 is a schematic structural diagram of an organic light-emitting display panel according to an embodiment of the present disclosure.

FIG. 1 illustrates a schematic structural diagram of an organic light-emitting display panel according to an embodiment of the present disclosure. The organic light-emitting display panel 1 includes an array substrate 10, and the array substrate 10 includes a plurality of driving elements (not shown). The organic light-emitting display panel 1 further includes an anode 12, a cathode 14 and an organic functional layer 13 between the anode 12 and the cathode 14.

It should be understood that, the anode 12 is in contact with a side of the array substrate 10, and the cathode 14 is located on a side of the organic functional layer 13 facing away from the array substrate 10.

The array substrate 10 in the present embodiment can be a flexible substrate, and the corresponding organic light-emitting display panel 1 can be a flexible organic light-emitting display panel. Since the flexible organic light-emitting display panel has special characteristics such as low power consumption, bendability and the like, it is applicable to diverse kinds of display devices, especially to a wearable display device. In an embodiment, the flexible substrate is made of polyester imide or polyethylene terephthalate resin. In addition, the array substrate 10 can also be a rigid substrate, and correspondingly, the organic light-emitting display panel 1 can be a rigid organic light-emitting display panel. In fact, the present disclosure does not specifically limit the material of the organic light-emitting display panel.

In the present embodiment, during an electroluminescence process, the anode 12 is applied with a positive voltage. In the present embodiment, the anode 12 can be made of indium tin oxide. The anode 12 at least includes a reflective film located on a side of the anode 12 facing away from the array substrate 10, and the reflective film can be made of silver. The anode 12 can further include a transparent conductive thin film located on a side of the reflective film facing away from the array substrate 10, and the transparent conductive thin film can be made of indium tin oxide or indium zinc oxide.

In the present embodiment, during the electroluminescence process, the cathode 14 is applied with a negative voltage. In order to improve the capacity of injecting the electron carriers from the cathode 14 into the organic functional layer 13, the cathode 14 can be made of a material or a composite metal material having low work function, such as Ag, Al, Ca, In, Li, Mg and the like.

Figure 2:
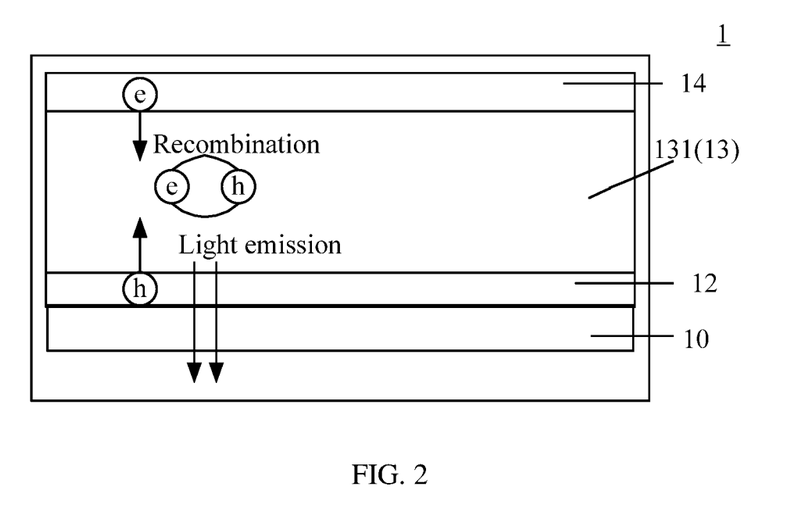
FIG. 2 is a schematic diagram of a principle of an organic light-emitting display panel according to an embodiment of the present disclosure.

FIG. 2 is a schematic diagram of a principle of an organic light-emitting display panel according to an embodiment of the present disclosure. Under an applied electric field, electrons e are injected from the cathode 14 into the organic functional layer 13, and the holes h are injected from the anode 12 to the organic functional layer 13. The injected electrons e and the injected holes h generate excitons after the organic light-emitting layer 131 is recombined. The excitons migrate under the effect of the electric field, and transmit energy to organic light-emitting molecules in the organic light-emitting layer 131. The electrons of the organic light-emitting molecules jump from a ground state to an excited state and release energy. Finally, the energy is released in a form of photons to emit light.

In the related art, since the electron mobility and the hole mobility are different, the recombination center of the electrons and holes will be deviate, so that the excitons may be dissipated as heat energy after the recombination of the electrons and holes. Since the recombination center of the electrons and holes is not in the organic light-emitting layer, the generated energy cannot be transmitted to the organic light-emitting molecules, and thus cannot generate photons to emit light.

In order to solve the above problem of the recombination center of the electrons and holes deviating, the present disclosure provides following technical solutions.

Figure 3:
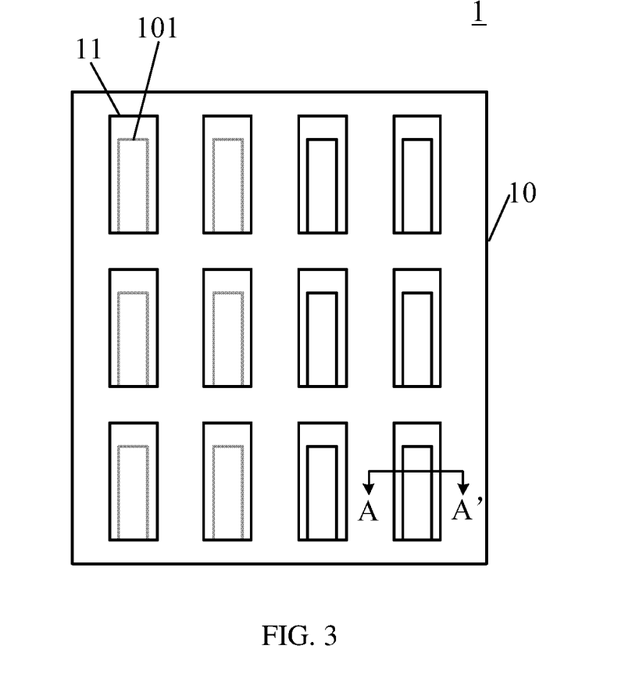
FIG. 3 is another schematic structural diagram of an organic light-emitting display panel according to an embodiment of the present disclosure.
Figure 4:
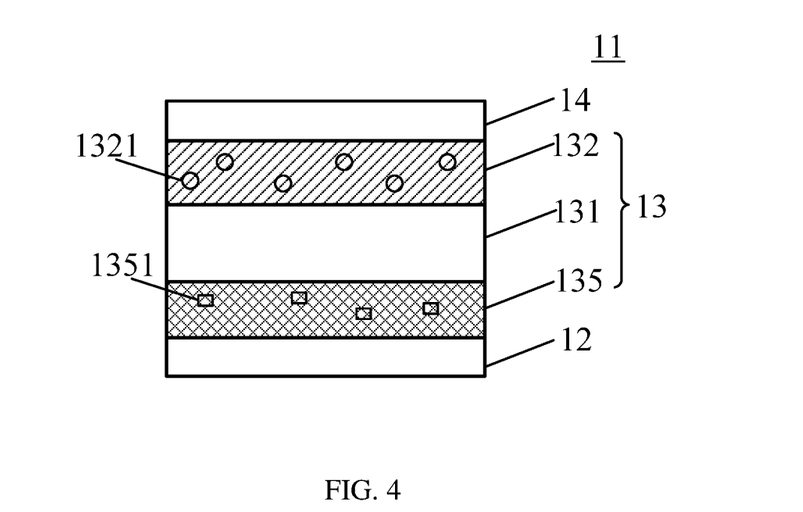
FIG. 4 is a cross-sectional view of an organic light-emitting component according to an embodiment of the present disclosure along AA' line in FIG. 3.

The present disclosure provides an organic light-emitting display panel, as shown in FIG. 3 and FIG. 4, where FIG. 3 is another schematic structural diagram of an organic light-emitting display panel according to an embodiment of the present disclosure, and FIG. 4 is a cross-sectional view of an organic light-emitting component according to an embodiment of the present disclosure along AA' line in FIG. 3. As shown in FIG. 3, the organic light-emitting display panel 1 includes an array substrate 10, and the array substrate 10 includes a plurality of driving elements 101. In order to illustrate a relation between the driving elements and the organic light-emitting components, the organic light-emitting components in FIG. 3 are set to have a transparency of 60%, so that the driving elements 101 covered by the organic light-emitting components can be viewed.

Referring to FIG. 4, the organic light-emitting display panel 1 further includes an organic light-emitting component 11 corresponding to a driving element 101. The organic light-emitting component 11 includes an anode 12, a cathode 14 and an organic functional layer 13 disposed between the anode 12 and the cathode 14. The organic functional layer 13 includes an organic light-emitting layer 131, a first electron transmission layer 132 disposed between the cathode 14 and the organic light-emitting layer 131, and a hole injection layer 135 disposed between the anode 12 and the organic light-emitting layer 131. The first electron transmission layer 132 includes an electron transmission matrix and a first dopant 1321, and the first dopant 1321 includes an alkaline earth metal element or a rare earth metal element. In addition, a lowest unoccupied molecular orbital of the electron transmission matrix in the first electron transmission layer 132 LUMO1 and a lowest unoccupied molecular orbital of a host material in the organic light-emitting layer 131 LUMO4 satisfy: |LUMO1−LUMO4|<1.7 eV, and a work function $\varphi1$ of the first dopant 1321 and a work function $\varphi4$ of the cathode 14 satisfy: $\varphi1<\varphi4$.

In the present embodiment, since the first dopant 1321 is disposed in the first electron transmission layer 132 and includes an alkaline earth metal element or a rare earth metal element, the first electron transmission layer 132 can improve the mobility of electron carriers and thus more electron carriers can migrate from the cathode 14 into the organic light-emitting layer 131.

In addition, when a negative bias is applied to the cathode, the electrons overcome a potential barrier and migrate toward a lower energy level until reaching the organic light-emitting layer. Therefore, it is conductive to the migration of electron carriers when the work function $\varphi1$ of the first dopant 1321 is smaller than the work function $\varphi4$ of the cathode 14. Further, since the lowest unoccupied molecular orbital of the electron transmission matrix in the first electron transmission layer 132 LUMO1 and the lowest unoccupied molecular orbital of the host material in the organic light-emitting layer 131 LUMO4 satisfy: |LUMO1−LUMO4|<1.7 eV, the energy level difference between these two lowest unoccupied molecular orbitals is relatively small, thereby reducing the potential barrier of injecting electrons, and facilitating injecting more electron carriers into the organic light-emitting layer 131.

Still referring to FIG. 4, the hole injection layer 135 includes a hole injection matrix and a second dopant 1351. A highest occupied molecular orbital of a hole injection matrix in the hole injection layer 135 HOMO5 and a highest occupied molecular orbital of the host material in the organic light-emitting layer 131 HOMO4 satisfy: |HOMO5−HOMO4|<1 eV. The second dopant is an inorganic material, and a work function $\varphi2$ of the second dopant and a work function $\varphi3$ of the anode satisfy: $\varphi2>\varphi3$. Alternatively, the second dopant is an organic material, and a lowest unoccupied molecular orbital LUMO of the second dopant and the work function $\varphi3$ of the anode satisfy |LUMO-$\varphi3$|<0.8 eV. The work function or lowest unoccupied molecular orbital LUMO of the second dopant satisfying the above conditions can facilitate injecting holes from anode into the hole injection layer.

When a positive bias is applied to the anode, the holes overcome a potential barrier and migrate toward a higher energy level until reaching the organic light-emitting layer 131. Therefore, it is conductive to the migration of hole carriers when the work function $\varphi2$ of the second dopant 1351 is greater than the work function $\varphi3$ of the anode 12. Further, since the highest occupied orbital energy of the hole injection matrix in the hole injection transmission layer 135 HOMO5 and the highest occupied orbital energy of the host material in the organic light-emitting layer 131 HOMO4 satisfy: |HOMO5−HOMO4|<1 eV, the energy level difference between these two highest occupied molecular orbitals is relatively small, thereby reducing the potential barrier of injecting holes, and facilitating injecting more hole carriers into the organic light-emitting layer.

In summary, the present embodiment can balance the electron mobility and the hole mobility, so that electrons and holes are recombined in the organic light-emitting layer, thereby avoiding the deviation of the recombination center of the electrons and holes and improving the light-emitting efficiency.

Figure 5:
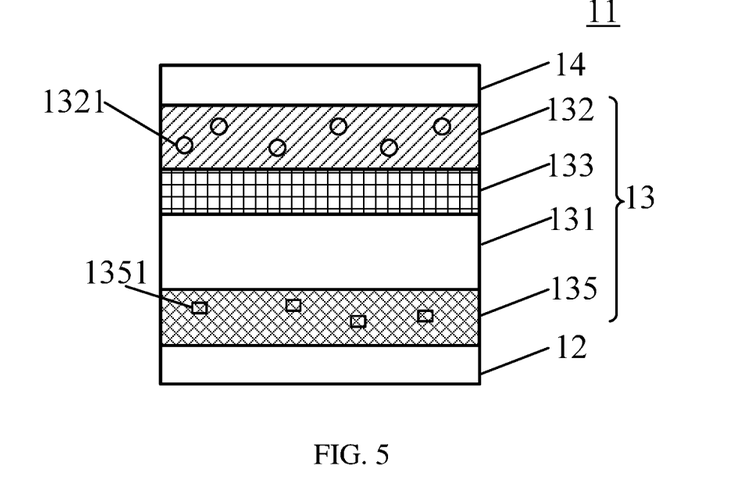
FIG. 5 is a cross-sectional view of an organic light-emitting component according to another embodiment of the present disclosure along AA' line in FIG. 3.

FIG. 5 is a cross-sectional view of an organic light-emitting component according to another embodiment of the present disclosure along AA' line in FIG. 3, where the organic functional layer 13 further includes a second electron transmission layer 133 located between the first electron transmission layer 132 and the organic light-emitting layer 131. The second electron transmission layer 133 is undoped by the first dopant. A highest occupied molecular orbital HOMO2 of an electron transmission matrix in the second electron transmission layer 133 and the highest occupied molecular orbital HOMO4 of the host material in the organic light-emitting layer 131 satisfy: |HOMO2−HOMO4|<1 eV.

In the present embodiment, since the second electron transmission layer 133 is located between the first electron transmission layer 132 and the organic light-emitting layer 131 and is undoped by the first dopant 1321, a diffusion of the first dopant 1321 into the organic light-emitting layer 131 can be effectively avoided, thereby preventing the photons generated by recombination of electrons and holes from being absorbed by the first dopant 1321. In this way, the light-emitting efficiency of the organic light-emitting display panel can be improved. In addition, since the highest occupied molecular orbital HOMO2 of the electron transmission matrix in the second electron transmission layer 133 and the highest occupied molecular orbital HOMO4 of the host material in the organic light-emitting layer 131 satisfy: |HOMO2−HOMO4|<1 eV, the migration of the hole carriers from the cathode to the organic light-emitting layer can be suppressed, and electron carriers can be prevented from being recombined with the hole carriers before reaching the organic light-emitting layer, which would otherwise negatively affect the light-emitting efficiency.

It should be noted that, in order to facilitate a comparison between a value of the highest occupied orbital energy HOMO2 of the electron transmission matrix in the second electron transmission layer 133 and a value of the highest occupied orbital energy HOMO4 of the host material in the organic light-emitting layer 131, the above two values discussed in the present disclosure are both set to be absolute values, so as to avoid a situation in which one of these two values is a positive value and the other one is a negative value. For example, the highest occupied orbital energy HOMO2 of the electron transmission matrix in the second electron transmission layer 133 is 6 eV, and the highest occupied orbital energy HOMO4 of the host material in the organic light-emitting layer 131 is 5 eV. In this way, since the holes transit to a higher energy state and the highest occupied orbital energy HOMO4 of the host material in the organic light-emitting layer 131 is relatively low, the transition of the holes can be suppressed and thus the second electron transmission layer has an effect of blocking the holes.

Figure 6:
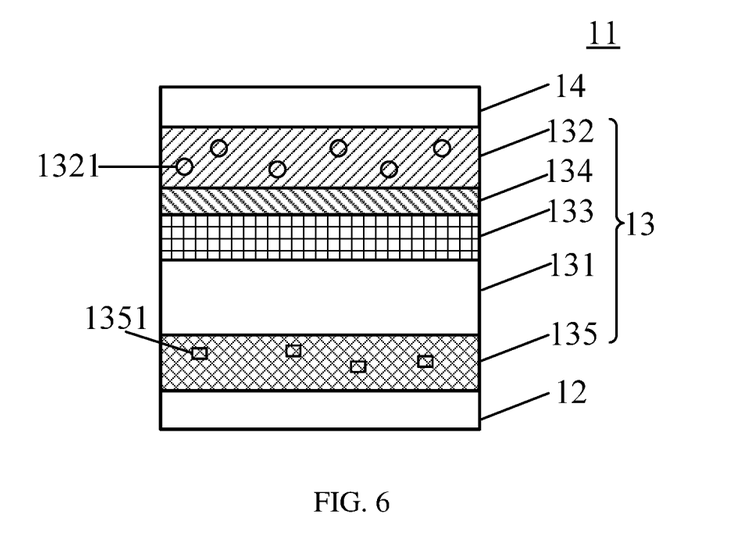
FIG. 6 is a cross-sectional view of an organic light-emitting component according to yet another embodiment of the present disclosure along AA' line in FIG. 3.

Further, FIG. 6 is a cross-sectional view of an organic light-emitting component according to yet another embodiment of the present disclosure along AA' line in FIG. 3. In this embodiment, the organic functional layer 13 further includes a third electron transmission layer 134 disposed between the first electron transmission layer 132 and the second electron transmission layer 133.

In the present embodiment, since the third electron transmission layer 134 is arranged between the first electron transmission layer 132 and the second electron transmission layer 133, a distance between the first electron transmission layer 132 including the first dopant 1321 and the organic light-emitting layer 131 increases, and thus the influence of the first dopant 1321 on the organic light-emitting layer 131 can be further blocked.

Moreover, in the transition of the electrons from the cathode 14 to the organic light-emitting layer 131, the electrons firstly transit from the first electron transmission layer 132 to the third electron transmission layer 134, and then transit to the second electron transmission layer 133, so as to form an energy level gradient of electron transition. In this way, electrons do not need to span the high energy level, thereby avoiding an accumulation of electrons at the interface, facilitating the injection of electrons, and improving a response speed of the organic light-emitting component.

Figure 7:
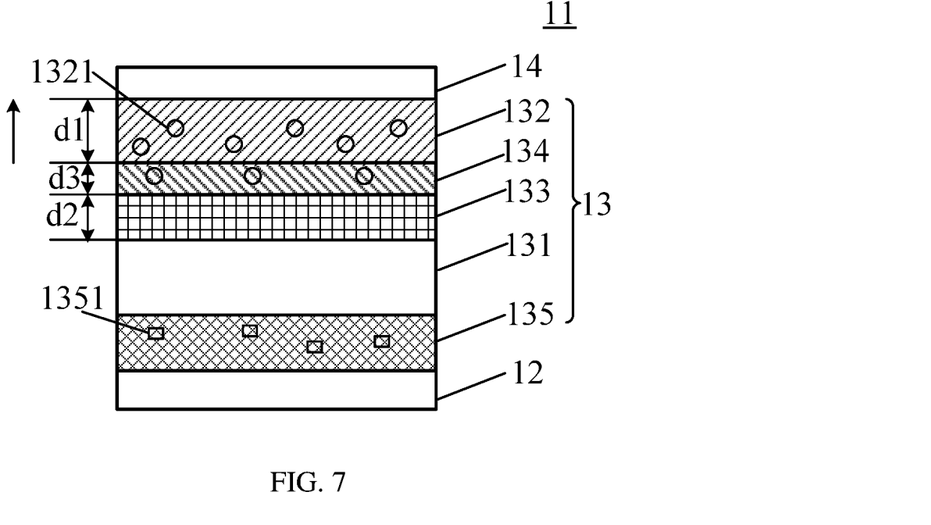
FIG. 7 is a cross-sectional view of an organic light-emitting component according to yet another embodiment of the present disclosure along AA' line in FIG. 3.

Further, FIG. 7 is a cross-sectional view of an organic light-emitting component according to yet another embodiment of the present disclosure along AA' line in FIG. 3. In this embodiment, the third electron transmission layer 134 includes the first dopant 1321. A doping concentration of the first dopant 1321 in the third electron transmission layer 134 is smaller than a doping concentration of the first dopant 1321 in the first electron transmission layer 132.

In this embodiment, since the doping concentration of the first dopant 1321 in the third electron transmission layer 134 is smaller than the doping concentration of the first dopant 1321 in the first electron transmission layer 132, a doping concentration gradient of the first dopant 1321 is formed in a direction from the cathode 14 to the organic light-emitting layer 131. In this way, the electrons do not need to span the high energy level, thereby avoiding an accumulation of electrons at the interface, facilitating the injection of electrons, and improving a response speed of the organic light-emitting component.

In addition, the third electron transmission layer 134 is closer to the organic light-emitting layer 131 than the first electron transmission layer 132. Only when the concentration of the first dopant 1321 in the third electron transmission layer 134 is smaller than the concentration of the first dopant 1321 in the first electron transmission layer 132, it can be ensured that the first dopant 1321 will not diffuse into the second electron transmission layer 132 and does not affect the organic light-emitting layer 131.

According to the above embodiment, although the third electron transmission layer 134 includes the first dopant 1321, since the second electron transmission layer 133 is disposed between the third electron transmission layer 134 and the organic light-emitting layer 131 and the second electron transmission layer 133 does not include the first dopant 1321, the first dopant 1321 can be effectively prevented from entering the organic light-emitting layer 131.

Further, a concentration of the first dopant 1321 at a side of the third electron transmission layer 134 close to the first electron transmission layer 132 is greater than a concentration of the first dopant 1321 at a side of the third electron transmission layer 134 away from the first electron transmission layer 132.

In the present embodiment, since the concentration of the first dopant 1321 in the third electron transmission layer 134 gradually decreases in a direction from the cathode 14 to the organic light-emitting layer 131, it can effectively prevent the first dopant 1321 from diffusing to the second electron transmission layer 132 and affecting the organic light-emitting layer 131.

Since the concentration of the first dopant 1321 in the first electron transmission layer 132 is relatively greater, the first dopant 1321 will diffuse toward the third electron transmission layer 134, so that the concentration of the first dopant 1321 in the third electron transmission layer 134 closer to the first electron transmission layer 132 is relatively greater.

In addition, since the third electron transmission layer 134 is provided with the first dopant 1321, the potential barrier of injecting the electron carriers from the first electron transmission layer 132 into the third electron transmission layer 134 is lowered, and the transition of the electron carriers can be utilized.

Referring to FIG. 7, in a direction perpendicular to the organic light-emitting display panel 1 (shown by an arrow in FIG. 7), the first electron transmission layer 132 has a thickness d1 greater than a thickness d2 of the second electron transmission layer 133. Since the first electron transmission layer 132 includes the first dopant 1321, the greater thickness of the first electron transmission layer 132 matches a diffusion range of the first dopant 1321. In this way, the first dopant 1321 can be prevented from diffusing to the second electron transmission layer 133, and thus the influence of the first dopant 1321 on the organic light-emitting layer 131 can be further avoided.

Still referring to FIG. 7, the third electron transmission layer 134 has a thickness d3 smaller than the thickness d2 of the second electron transmission layer 133. In a case where the organic light-emitting component 11 has a required film layer thickness, since the second electron transmission layer 133 is in contact with the organic light-emitting layer 131, i.e., the second electron transmission layer 133 is closer to the organic light-emitting layer than the third electron transmission layer 134, the first dopant 1321 in the third electron transmission layer 134 can be further prevented from affecting the organic light-emitting layer 131 when the thickness d2 of the second electron transmission layer 133 is greater than the thickness d3 of the third electron transmission layer 134, thereby ensuring the light-emitting efficiency.

It should be understood that, in other embodiments, the thickness d3 of the third electron transmission layer 134 can also be greater than the thickness d2 of the second electron transmission layer 133, and the thickness d1 of the first electron transmission layer 132 can also be smaller than the thickness d2 of the second electron transmission layer 133. The thicknesses of these electron transmission layers can be set according to a specific product.

In a further embodiment, a material of the electron transmission matrix in the third electron transmission layer 134 is the same as a material of the electron transmission matrix in the first electron transmission layer 132. For example, the electron transmission matrix of the third electron transmission layer 134 can be made of bipyridine, triazine ring or lithium quinoline (LIQ) or the like, thereby improving the mobility of electron carriers and the injection efficiency of electron carriers.

Alternatively, the material of the electron transmission matrix in the third electron transmission layer 134 is the same as a material of the electron transmission matrix in the second electron transmission layer 133. For example, the electron transmission matrix of the third electron transmission layer 134 can be made of carbazole material, thiophene material, fluorene material or a spiro material, so that the mobility of the hole carrier can be suppressed, thereby preventing the electron carriers and hole carriers from being accumulated and recombined in the third electron transmission layer 134.

It can be understood that, in the present embodiment, the electron transmission matrix of the first electron transmission layer 132 is different from the electron transmission matrix of the second electron transmission layer 13. The second electron transmission layer 133 can be treated as a hole blocking layer. In this way, on the one hand, the mobility of the electron carriers can be improved, and on the other hand, the mobility of the hole carriers can be suppressed and the electron carriers and the hole carriers can be prevented from being accumulated and thus recombined in the second electron transmission layer 133. In addition, the second electron transmission layer 133 without the first dopant 1321 can effectively prevent the first dopant 1321 from entering the organic light-emitting layer 131, thereby avoiding the influence of the first dopant 1321 on the organic light-emitting layer.

Figure 8:
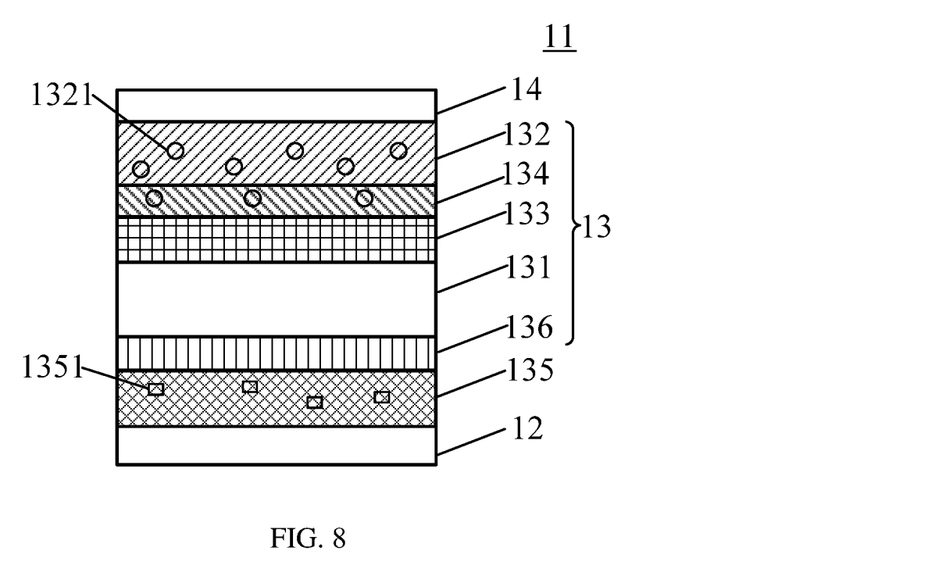
FIG. 8 is a cross-sectional view of an organic light-emitting component according to yet another embodiment of the present disclosure along AA' line in FIG. 3.

FIG. 8 is a cross-sectional view of an organic light-emitting component according to yet another embodiment of the present disclosure along AA' line in FIG. 3. In this embodiment, the organic functional layer further includes a first hole transmission layer 136 located between the hole injection layer 135 and the organic light-emitting layer 131.

In the present embodiment, a highest occupied molecular orbital HOMO6 of a hole transmission matrix in the first hole transmission layer 136 and the highest occupied molecular orbital HOMO4 of the host material in the organic light-emitting layer 131 satisfy: |HOMO6−HOMO4|<0.8 eV.

In the present embodiment, since the highest occupied molecular orbital HOMO6 of the hole transmission matrix in the first hole transmission layer 136 and the highest occupied molecular orbital HOMO4 of the host material in the organic light-emitting layer 131 satisfy: |HOMO6−HOMO4|<0.8 eV, on the one hand, the migration of the hole carriers to the organic light-emitting layer can be enhanced and the light-emitting efficiency can be improved; and on the other hand, the energy level difference between the highest occupied molecular orbital HOMO6 of the hole transmission matrix in the first hole transmission layer 136 and the highest occupied molecular orbital HOMO4 of the host material in the organic light-emitting layer 131 is relatively small, thereby reducing the potential barrier of injecting holes and facilitating injecting more holes.

Figure 9:
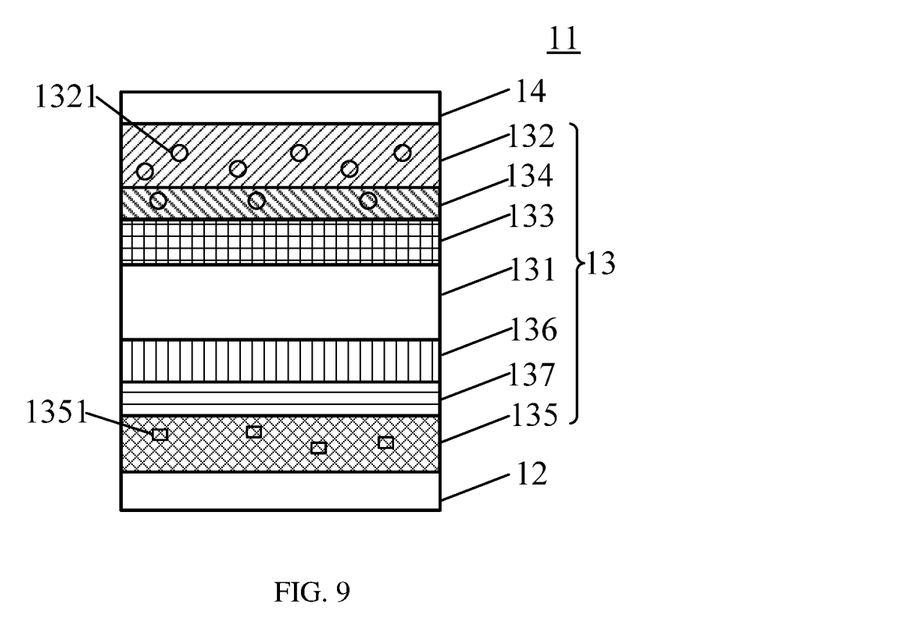
FIG. 9 is a cross-sectional view of an organic light-emitting component according to yet another embodiment of the present disclosure along AA' line in FIG. 3.

Further, FIG. 9 is a cross-sectional view of an organic light-emitting component according to yet another embodiment of the present disclosure along AA' line in FIG. 3. In this embodiment, the organic functional layer 13 further includes a second hole transmission layer 137 located between the hole injection layer 135 and the first hole transmission layer 136.

In the present disclosure, the holes firstly transit from the anode 12 to the organic light-emitting layer 131, and then transit from the hole injection layer 135 to the second hole transmission layer 137 and then transit to the first hole transmission layer 136, so as to form an energy level gradient of hole transition. In this way, holes do not need to span the high energy level, thereby avoiding an accumulation of holes at the interface, facilitating the injection of holes, and improving a response speed of the organic light-emitting component.

It should be noted that, in this embodiment, the second hole transmission layer 137 may not include the second dopant 1351. In this way, the mobility of holes from the anode 12 to the organic light-emitting layer 131 can be matched with the mobility of electrons from the cathode 14 to the organic light-emitting layer 131, thereby avoiding the deviation of the recombination center of the holes and electrons.

Figure 10:
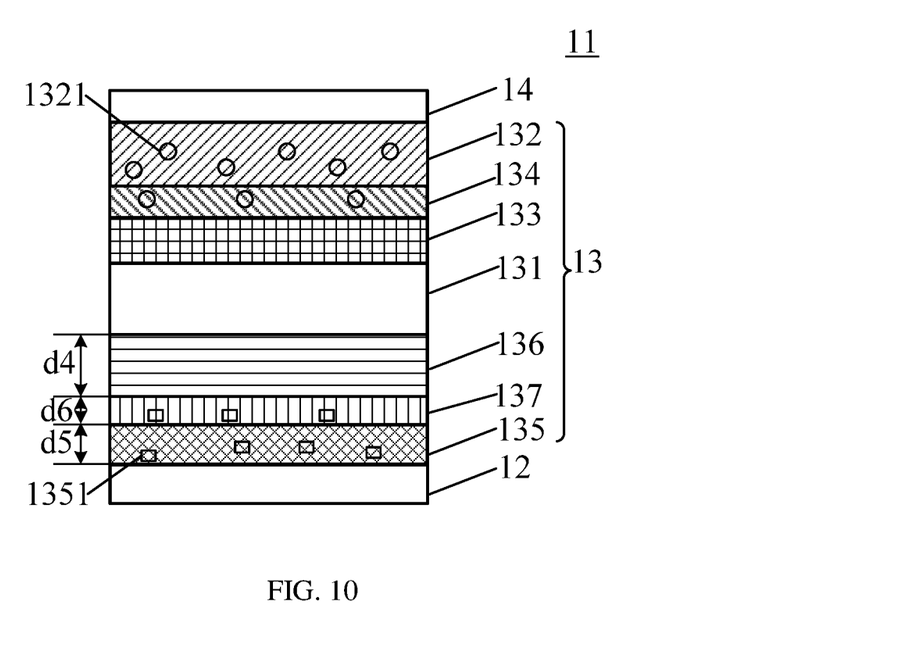
FIG. 10 is a cross-sectional view of an organic light-emitting component according to yet another embodiment of the present disclosure along AA' line in FIG. 3.

Further, FIG. 10 is a cross-sectional view of an organic light-emitting component according to yet another embodiment of the present disclosure along AA' line in FIG. 3. In this embodiment, the second hole transmission layer 137 includes the second dopant 1351, and a doping concentration of the second dopant 1351 in the second hole transmission layer 137 is smaller than a doping concentration of the second dopant 1351 in the hole injection layer 135.

In this embodiment, since the doping concentration of the second dopant in the second hole transmission layer 137 is smaller than a doping concentration of the second dopant in the hole injection layer, a doping concentration gradient is formed in a direction from the anode 12 to the organic light-emitting layer 131. In this way, the holes do not need to span the high energy level, thereby avoiding an accumulation of holes at the interface, facilitating the injection of holes, and improving a response speed of the organic light-emitting component.

In an embodiment, the second dopant 1351 is a P-type dopant having a lowest occupied orbital energy LUMO deeper than 4.5 eV. The P-type dopant is doped in the hole injection layer 135 and the lowest occupied orbital energy LUMO has an absolute value larger than 4.5 eV, which can reduce the potential barrier between the hole injection layer and the anode 12, so that the hole carriers generated by the anode 12 can be more easily injected into the hole injection layer 135.

Further, the second dopant 1351 is doped in the hole injection layer 135 in a volume percentage of 0.2% to 5%. With an increase in the volume percentage of the second dopant 1351 doped in the hole injection layer 135, a hole injection efficiency is improved. On the contrary, with increase in the volume percentage of the second dopant 1351 doped in the hole injection layer 135, a light transmittance of the hole injection layer 135 is negatively affected. Therefore, in the present embodiment, the volume percentage is set between 0.2% and 5%, in order to balance the light transmittance and hole injection efficiency of the hole injection layer 135.

Still referring to FIG. 10, the second hole transmission layer 137 includes the second dopant 1351, and a concentration of the second dopant 1351 at a side of the second hole transmission layer 137 close to the hole injection layer 135 is greater than a concentration of the second dopant 1351 at a side of the second hole transmission layer 137 away from the hole injection layer 135.

In combination with the above embodiments, in order to reduce the potential barrier between the hole injection layer 135 and the anode 12 and increase the hole injection efficiency, the concentration of the second dopant 1351 in the hole injection layer 135 is relatively greater, and the second dopant 1351 diffuses in the hole injection layer 135. Therefore, the concentration of the second dopant 1351 at the side of the second hole transmission layer 137 close to the hole injection layer 135 is relatively greater.

In addition, the concentration of the second dopant 1351 in the second hole transmission layer 137 exhibits a decreasing tendency in the direction from the anode 12 to the organic light-emitting layer 131, so as to prevent the second dopant 1351 from affecting the organic light-emitting layer 131. A concentration gradient of the second dopant 1351 is formed in the direction from the anode 12 to the organic light-emitting layer 131, so that the holes do not need to span the high energy level, thereby avoiding the accumulation of holes at the interface, facilitating the injection of holes, and improving the response speed of organic light-emitting device.

In addition, still referring to FIG. 10, a thickness d4 of the first hole transmission layer 136 is greater than a thickness d5 of the hole injection layer 135, and the thinner hole injection layer 135 is conductive to the injected holes rapidly migrating to the organic light-emitting layer 131, thereby increasing the number of hole carriers that migrate to the organic light-emitting layer 131.

In other embodiments, the thickness d4 of the first hole transmission layer 136 can also be smaller than the thickness d5 of the hole injection layer 135, and a thickness d6 of the second hole transmission layer 137 can be smaller than the thickness of the first hole transmission layer 136. The above three thicknesses are not specifically limited in the present disclosure and can be set depending on the specific product.

In an embodiment, a material of a hole transmission matrix in the second hole transmission layer 137 is the same as a material of the hole injection matrix in the hole injection layer 135. Since the materials of the hole transmission matrix and the hole injection matrix are the same, the second hole transmission layer 137 can be treated as a hole injection layer. In this way, a potential barrier at an interface between the anode 12 and the hole injection layer 135 is the same as a potential barrier at an interface between the hole injection layer 135 and the second hole transmission layer 137, which is conductive to the injection of the hole carriers and in turn increases the number of hole carriers that migrate to the organic light-emitting layer 131.

In an embodiment, the hole mobility in the first hole transmission layer 136 and the electron mobility of the second electron transmission layer 133 satisfy:

$$|\log_{10}[Hm(\text{HTL1})] - \log_{10}[Em(\text{ETL2})]| < 4.$$

In this embodiment, when the hole mobility in the first hole transmission layer 136 and the electron mobility in the second electron transmission layer 133 satisfy the above relation, that is, a number of the hole carriers the transit from the first holes transmission layer 136 to the organic light-emitting layer 131 and a number of electron carriers that transit from the second electron transmission layer 133 to the organic light-emitting layer 131 reach a certain ratio required for the recombination thereof, the light-emitting efficiency can be improved.

In another embodiment, the thickness d6 of the second hole transmission layer 137 and the thickness d2 of the second electron transmission layer 133 satisfy: d6>6d2.

In this embodiment, when the thickness of the second hole transmission layer 137 and the thickness of the second electron transmission layer 133 satisfy the above relation, the mobility of the electron carriers that transit to the organic light-emitting layer and the mobility of the hole carriers that transit to the organic light-emitting layer are balanced, so that the electron carriers and hole carriers are recombined in the organic light-emitting layer, thereby improving the light-emitting efficiency.

It should be understood that, in other embodiments, the thickness of the second hole transmission layer 137 can also be smaller than the thickness of the second electron transmission layer. This can be set according to a specific product.

In an embodiment, the first dopant 1321 is doped in the first electron transmission layer 132 in a volume percentage of 0.5%-7%. The larger the volume percentage of the first dopant 1321 doped in the first electron transmission layer 132 is, the faster the mobility of the electron carriers is. However, considering that the first dopant 1321 includes an alkaline earth metal element or a rare earth metal element, the light transmittance of the first electron transmission layer 132 may be influenced. Therefore, the volume ratio of the first dopant 1321 in the first electron transmission layer 132 is set in the present embodiment, in order to balance the mobility of the electron carrier and the light transmittance of the first electron transmission layer 132. When the volume percentage of the first dopant 1321 doped in the first electron transmission layer 132 is smaller than 0.5%, the mobility of the electron carriers will be affect. When the volume percentage of the first dopant 1321 doped in the first electron transmission layer 132 is greater than 7%, the light transmittance of the first electron transmission layer 132 will be reduced, which in turn affects a quantity of the emitted light of the organic light-emitting display panel 1. For example, when the volume percentage of the first dopant 1321 doped in the first electron transmission layer 132 is in the range of 0.5%-7%, the light transmittance of the first electron transmission layer 132 is greater than 65%.

In an embodiment, the first dopant 1321 can include at least one of alkaline earth metal elements Mg and Ga, or the first dopant 1321 can include at least one of lanthanide series of rare earth metal elements such as Yb, Sm and Tm, or the first dopant 1321 can include at least one of rare earth metal elements Y, Gd and Lu.

Since the first dopant 1321 includes at least one of Mg, Ga, Yb, Sm, Tm, Y, Gd or Lu, the first electron transmission layer 132 and the third electron transmission layer 134 containing the first dopant 1321 can effectively improve the mobility and injection efficiency of the electron carriers, thereby improving the light-emitting effect of the organic light-emitting display panel 1.

Further, the first dopant 1321 can be an alkaline earth metal element or a rare earth metal element. That is, the first dopant 1321 doped into the first electron transmission layer 132 and the third electron transmission layer 134 exists in a form of elementary metal.

In an embodiment, the first dopant 1321 can be a metallic compound. That is, the first dopant 1321 doped into the first electron transmission layer 132 and the third electron transmission layer 134 exists in a form of a metallic compound. For example, the metallic compound can be a metal oxide, such as magnesium oxide or calcium oxide; or the metallic compound can be a metal halide, such as lithium fluoride; or the metallic compound can be a metal complex, such as lithium quinoline.

It should be noted that the first dopant 1321 can improve the mobility of electron carriers and reduce the potential barrier of injecting electrons carrier, despite of the form of the first dopant 1321 existing in the first electron transmission layer 132 and the third electron transmission layer 134.

Figure 11:
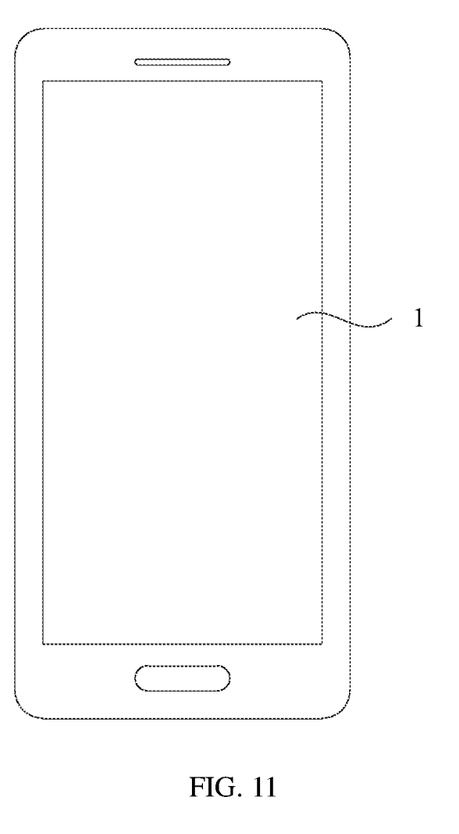
FIG. 11 is a schematic structural diagram of an organic light-emitting display device according to an embodiment of the present disclosure.

FIG. 11 is a schematic structural diagram of an organic light-emitting display device according to an embodiment of the present disclosure. The organic light-emitting display device includes the organic light-emitting display panel 1 described above. It should be noted that, although a mobile phone is taken as an example in FIG. 11, the organic light-emitting display device is not limited thereto. Specifically, the organic light-emitting display device can include but not limited to electronic devices having display function such as personal computer (PC), personal digital assistant (PDA), wireless handhold device, tablet computer, MP4 player, television, or the like.

In the present disclosure, the organic light-emitting display device includes the above organic light-emitting display panel 1, and thus the organic light-emitting display device can achieve all the beneficial effects accomplished by the above organic light-emitting display panel 1. That is, the first electron transmission layer includes the first dopant, and the first dopant includes an alkaline earth metal element or a rare earth metal element. In this way, the mobility of the electron carriers can be enhanced by the first electron transmission layer, and thus more electron carriers can transit from cathode to the organic light-emitting layer. In addition, when a negative bias is applied to the cathode, the electron carriers overcome the potential barrier and transit toward a lower energy level until they reach the organic light-emitting layer. Therefore, it is conductive to the migration of electron carriers when the work function $\varphi 1$ of the first dopant is smaller than the work function $\varphi 4$ of the cathode. Further, since the lowest unoccupied molecular orbital of the electron transmission matrix in the first electron transmission layer LUMO1 and the lowest unoccupied molecular orbital of the host material in the organic light-emitting layer LUMO4 satisfy: |LUMO1−LUMO4|<1.7 eV, the energy level difference between these two lowest unoccupied molecular orbitals is relatively small, thereby reducing the potential barrier of injecting electrons, and facilitating injecting more electron carriers into the organic light-emitting layer. When a positive bias is applied to the anode, the hole carriers overcome a potential barrier and migrate toward a higher energy level until they reach the organic light-emitting layer. Therefore, it is conductive to the migration of hole carriers when the work function $\varphi 2$ of the second dopant 1351 is greater than the work function $\varphi 3$ of the anode. Further, since the highest occupied molecular orbital of the hole injection matrix in the hole injection transmission layer 135 HOMO5 and the highest occupied molecular orbital of the host material in the organic light-emitting layer 131 HOMO4 satisfy: |HOMO5−HOMO4|<1 eV, the energy level difference between these two highest occupied molecular orbitals is relatively small, thereby reducing the potential barrier of injecting holes, and facilitating injecting more hole carriers into the organic light-emitting layer. In summary, in the embodiments of the present disclosure, the mobility of electrons and the mobility of holes can be balanced, so as to achieve the recombination of the electrons and holes in the organic light-emitting layer, thereby avoiding the deviation of the recombination center of the electrons and holes and improving the light-emitting efficiency.

Finally, it should be noted that the above embodiments are used to illustrate, but not to limit the technical solutions of the present disclosure. Although the present disclosure is illustrated in detail with reference to the above embodiments, those skilled in the art can still modify the technical solutions recorded in the above embodiments, or equivalently replace part or all of the technical features. However, any modification or replacement will not lead to a derivation of the essence of the technical solutions from the scope of the embodiments of the present disclosure.

What is claimed is:
1. An organic light-emitting display panel, comprising:
an array substrate comprising a plurality of driving elements;
a plurality of organic light-emitting components corresponding to the plurality of driving elements, wherein each of the plurality of organic light-emitting components comprises an anode, a cathode and an organic functional layer disposed between the anode and the cathode, wherein the organic functional layer comprises an organic light-emitting layer, a first electron transmission layer disposed between the cathode and the organic light-emitting layer, and a hole injection layer disposed between the anode and the organic light-emitting layer,
wherein the first electron transmission layer comprises an electron transmission matrix and a first dopant, wherein the first dopant comprises an alkaline earth metal element or a rare earth metal element, and the hole injection layer comprises a hole injection matrix and a second dopant;
a lowest unoccupied molecular orbital of the electron transmission matrix in the first electron transmission layer LUMO1 and a lowest unoccupied molecular orbital of a host material in the organic light-emitting layer LUMO4 satisfy: |LUMO1−LUMO4|<1.7 eV,
a highest occupied molecular orbital of a hole injection matrix in the hole injection layer HOMO5 and a highest occupied molecular orbital of the host material in the organic light-emitting layer HOMO4 satisfy: |HOMO5−HOMO4|<1 eV,
a work function $\varphi 1$ of the first dopant is smaller than a work function $\varphi 4$ of the cathode,
the second dopant is an inorganic material, and a work function $\varphi 2$ of the second dopant is greater than a work function $\varphi 3$ of the anode,
the organic functional layer further comprises a second electron transmission layer disposed between the first electron transmission layer and the organic light-emitting layer, and the second electron transmission is undoped by the first dopant,
a highest occupied molecular orbital of an electron transmission matrix in the second electron transmission layer HOMO2 and the highest occupied molecular orbital of the host material in the organic light-emitting layer HOMO4 satisfy: |HOMO2−HOMO4|<1 eV,
the organic functional layer further comprises a third electron transmission layer disposed between the first electron transmission layer and the second electron transmission layer,
the third electron transmission layer contains the first dopant, and a doping concentration of the first dopant in the third electron transmission layer is smaller than a doping concentration of the first dopant in the first electron transmission layer, and
a material of an electron transmission matrix in the third electron transmission layer is a same material as a material of an electron transmission matrix in the second electron transmission layer;
wherein the organic functional layer further comprises a first hole transmission layer located between the hole injection layer and the organic light-emitting layer, and
wherein a highest occupied molecular orbital of a hole transmission matrix in the first hole transmission layer HOMO6 and the highest occupied molecular orbital of the host material in the organic light-emitting layer HOMO4 satisfy: |HOMO6−HOMO4|<0.8 eV;

wherein the first hole transmission layer and the second electron transmission layer are in direct contact with the organic light-emitting layer, and a hole mobility in the first hole transmission layer and an electron mobility in the second electron transmission layer satisfy:

$|\log_{10}[Hm(\text{HTL1})] - \log_{10}[Em(\text{ETL2})]| < 4.$

2. The organic light-emitting display panel according to claim 1, wherein a concentration of the first dopant at a side of the third electron transmission layer close to the first electron transmission layer is greater than a concentration of the first dopant at a side of the third electron transmission layer away from the first electron transmission layer.

3. The organic light-emitting display panel according to claim 2, wherein the material of the electron transmission matrix in the third electron transmission layer is a same material as a material of the electron transmission matrix in the first electron transmission layer.

4. The organic light-emitting display panel according to claim 1, wherein the organic functional layer further comprises a second hole transmission layer located between the hole injection layer and the first hole transmission layer.

5. The organic light-emitting display panel according to claim 4, wherein the second hole transmission layer contains the second dopant, and a doping concentration of the second dopant in the second hole transmission layer is smaller than a doping concentration of the second dopant in the hole injection layer.

6. The organic light-emitting display panel according to claim 4, wherein the second hole transmission layer contains the second dopant, and
wherein a concentration of the second dopant at a side of the second hole transmission layer close to the hole injection layer is greater than a concentration of the second dopant at a side of the second hole transmission layer away from the hole injection layer.

7. The organic light-emitting display panel according to claim 4, wherein a material of a hole transmission matrix in the second hole transmission layer is a same material as a material of the hole injection matrix in the hole injection layer.

8. The organic light-emitting display panel according to claim 4, wherein a thickness d6 of the second hole transmission layer and a thickness d2 of the second electron transmission layer satisfy: d6>6d2.

9. The organic light-emitting display panel according to claim 1, wherein the first dopant is doped in the first electron transmission layer in a volume percentage of 0.5%-7%.

10. The organic light-emitting display panel according to claim 1, wherein the first dopant comprises at least one of Mg, Ga, Yb, Sm, Tm, Y, Gd or Lu.

11. The organic light-emitting display panel according to claim 1, wherein the first dopant is an alkaline earth elementary metal or a rare earth elementary metal.

12. The organic light-emitting display panel according to claim 1, wherein the first dopant is a metallic compound.

13. The organic light-emitting display panel according to claim 1, wherein the second dopant is a P-type dopant having a lowest occupied molecular orbital LUMO deeper than 4.5 eV, and the second dopant is doped in the hole injection layer in a volume percentage of 0.2% to 5%.

14. An organic light-emitting display device, comprising the organic light-emitting display panel according to claim 1.

15. An organic light-emitting display panel, comprising:
an array substrate comprising a plurality of driving elements;
a plurality of organic light-emitting components corresponding to the plurality of driving elements, wherein each of the plurality of organic light-emitting components comprises an anode, a cathode and an organic functional layer disposed between the anode and the cathode, wherein the organic functional layer comprises an organic light-emitting layer, a first electron transmission layer disposed between the cathode and the organic light-emitting layer, and a hole injection layer disposed between the anode and the organic light-emitting layer,
wherein the first electron transmission layer comprises an electron transmission matrix and a first dopant, wherein the first dopant comprises an alkaline earth metal element or a rare earth metal element, and the hole injection layer comprises a hole injection matrix and a second dopant;
a lowest unoccupied molecular orbital of the electron transmission matrix in the first electron transmission layer LUMO1 and a lowest unoccupied molecular orbital of a host material in the organic light-emitting layer LUMO4 satisfy: |LUMO1−LUMO4|<1.7 eV,
a highest occupied molecular orbital of a hole injection matrix in the hole injection layer HOMO5 and a highest occupied molecular orbital of the host material in the organic light-emitting layer HOMO4 satisfy: |HOMO5−HOMO4|<1 eV,
a work function φ1 of the first dopant is smaller than a work function φ4 of the cathode,
the second dopant is an organic material, and a lowest unoccupied molecular orbital LUMO of the second dopant and the work function φ3 of the anode satisfy |LUMO−φ3|<0.8 eV,
the organic functional layer further comprises a second electron transmission layer disposed between the first electron transmission layer and the organic light-emitting layer, and the second electron transmission is undoped by the first dopant,
a highest occupied molecular orbital of an electron transmission matrix in the second electron transmission layer HOMO2 and the highest occupied molecular orbital of the host material in the organic light-emitting layer HOMO4 satisfy: |HOMO2−HOMO4|<1 eV,
the organic functional layer further comprises a third electron transmission layer disposed between the first electron transmission layer and the second electron transmission layer,
the third electron transmission layer contains the first dopant, and a doping concentration of the first dopant in the third electron transmission layer is smaller than a doping concentration of the first dopant in the first electron transmission layer,
a material of an electron transmission matrix in the third electron transmission layer is a same material as a material of an electron transmission matrix in the second electron transmission layer;
wherein the organic functional layer further comprises a first hole transmission layer located between the hole injection layer and the organic light-emitting layer, and
wherein a highest occupied molecular orbital of a hole transmission matrix in the first hole transmission layer HOMO6 and the highest occupied molecular orbital of the host material in the organic light-emitting layer HOMO4 satisfy: |HOMO6−HOMO4|<0.8 eV;

wherein the first hole transmission layer and the second electron transmission layer are in direct contact with the organic light-emitting layer, and a hole mobility in the first hole transmission layer and an electron mobility in the second electron transmission layer satisfy:

$|\log_{10}[Hm(\text{HTL1})] - \log_{10}[Em(\text{ETL2})]| < 4$.

* * * * *